United States Patent [19]

Spencer et al.

[11] Patent Number: 4,559,486
[45] Date of Patent: Dec. 17, 1985

[54] DETECTOR FOR SHORTED ROTATING DIODE OF A BRUSHLESS ALTERNATOR

[75] Inventors: William Spencer, Rockford; Melvin C. Jackovich, Stillman Valley, both of Ill.

[73] Assignee: Sundstrand Corporation, Rockford, Ill.

[21] Appl. No.: 565,346

[22] Filed: Dec. 27, 1983

[51] Int. Cl.⁴ .............................................. H02K 11/00
[52] U.S. Cl. ....................................... 322/99; 340/645; 361/20; 361/84; 363/53
[58] Field of Search .................. 340/645, 650; 361/18, 361/20, 21, 82, 84; 363/52, 53; 322/99, DIG. 2

[56] References Cited

U.S. PATENT DOCUMENTS

| | | | |
|---|---|---|---|
| 3,210,603 | 10/1965 | Calfee et al. | 361/93 |
| 3,534,228 | 10/1970 | Hyvarinen et al. | 361/86 |
| 3,656,135 | 4/1972 | Ruff | 340/661 |
| 3,705,331 | 12/1972 | South et al. | 322/25 |
| 4,019,120 | 4/1977 | Fattic | 340/645 |
| 4,186,391 | 1/1980 | Wang et al. | 363/53 |
| 4,217,621 | 8/1980 | Johnson | 340/645 |
| 4,259,636 | 3/1981 | Buser et al. | 363/53 |
| 4,314,193 | 2/1982 | Mortonson | 322/99 |
| 4,315,204 | 2/1982 | Sievers et al. | 322/99 |
| 4,345,199 | 8/1982 | Voss | 322/99 |
| 4,348,629 | 9/1982 | Sievers et al. | 322/99 |
| 4,379,990 | 4/1983 | Sievers et al. | 322/99 |

Primary Examiner—William H. Beha, Jr.
Assistant Examiner—Jeffrey Sterrett
Attorney, Agent, or Firm—Wood, Dalton, Phillips, Mason & Rowe

[57] ABSTRACT

A circuit for detecting the occurrence of a shorted diode in the rotating rectifier of a brushless alternator. A sensing circuit is responsive to the direction of current flow through the exciter field winding. A reversal of the current indicates that there is a shorted rectifier diode.

5 Claims, 2 Drawing Figures

DETECTOR FOR SHORTED ROTATING DIODE OF A BRUSHLESS ALTERNATOR

FIELD OF THE INVENTION

This invention relates to a circuit for detecting the occurrence of a shorted diode in the rectifier of the rotating field of a brushless alternator.

BACKGROUND OF THE INVENTION

A typical brushless alternator has an exciter field winding which is a part of the stator structure of the machine. The rotor of the alternator includes an exciter armature in which an alternating output is developed. A rectifier which is a part of the rotor is connected with the exciter armature and provides direct current excitation for the main field winding. The alternator output is developed in the stator armature windings. The exciter field is connected through a regulator transistor with a DC source. A diode is connected in parralel with the transistor and reversely poled with respect thereto. A voltage regulator circuit provides a pulse width modulated drive signal to the regulator transistor in accordance with the output voltage of the alternator.

A failed diode in the rotating rectifier causes malfunctioning of the regulator/generator combination and must be detected to avoid damage to the system. Prior circuits have, for example, responded to the frequency and amplitude of the ripple current in the field winding, Calfee et al. No. 3,210,603 and Hyvarinen No. 3,534,228, or compared the exciter field voltage with the alternator output, South No. 3,705,331.

SUMMARY OF THE INVENTION

The present invention provides a detector for a shorted diode rectifier in a brushless alternator, which senses the direction of current flow through the exciter field winding circuit as an indication of the rectifier fault.

More particularly, a resistor is connected in series with the parallel combination of the voltage regulator transistor and reversely connected diode. The detector sensing circuit is responsive to polarity of the voltage across the series resistor.

Further features and advantages of the invention will be apparent from the following specification and from the drawings.

DETAILED DESCRIPTION OF THE INVENTION

Figure 1:
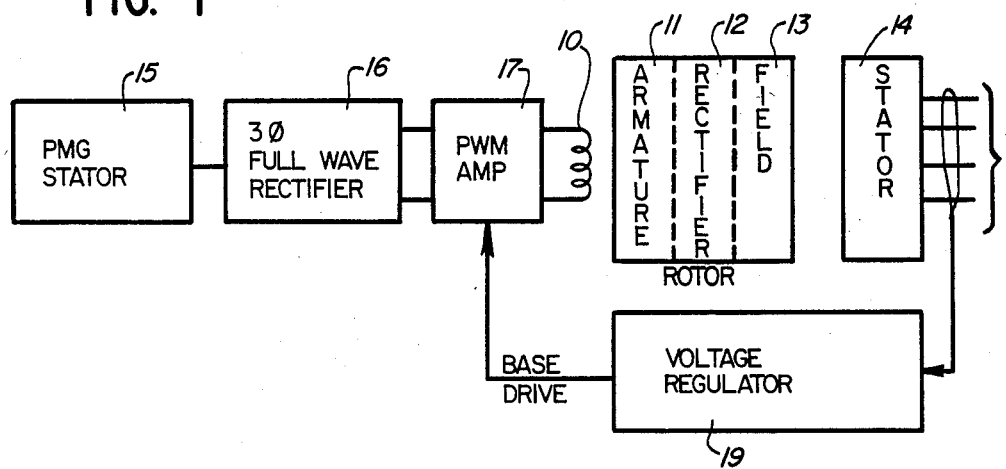
FIG. 1 is a block diagram of a brushless alternator illustrating the system in which the detector is used.

A brushless alternator system, elements of which are shown diagrammatically in FIG. 1, has an exciter with a stationary field winding 10. The rotor of the machine is driven by a prime mover (not shown) and includes an exciter armature winding 11 in which an alternating voltage, typically three phase, is generated. A rectifier 12 is connected with the armature and provides DC current to the main alternator field winding 13. Rectifier 12 is typically a three phase, full wave rectifier using mix semiconductor diodes. The alternator output is developed in stator 14, providing three phase power to a load (not shown).

Power for the exciter field is, in the system illustrated, developed in the stator winding 15 of a permanent magnet generator (PMG) which has a permanent magnet (not shown) mechanically a part of the main machine rotor. The three phase output of the PMG is connected with a three phase full wave rectifier 16 which provides DC power to a pulse width modulated amplifier 17 that controls the current to exciter field winding 10. Voltage regulator 19 is responsive to the output voltage of the main machine providing an appropriate base drive signal to pulse width modulated amplifier 17.

Figure 2:
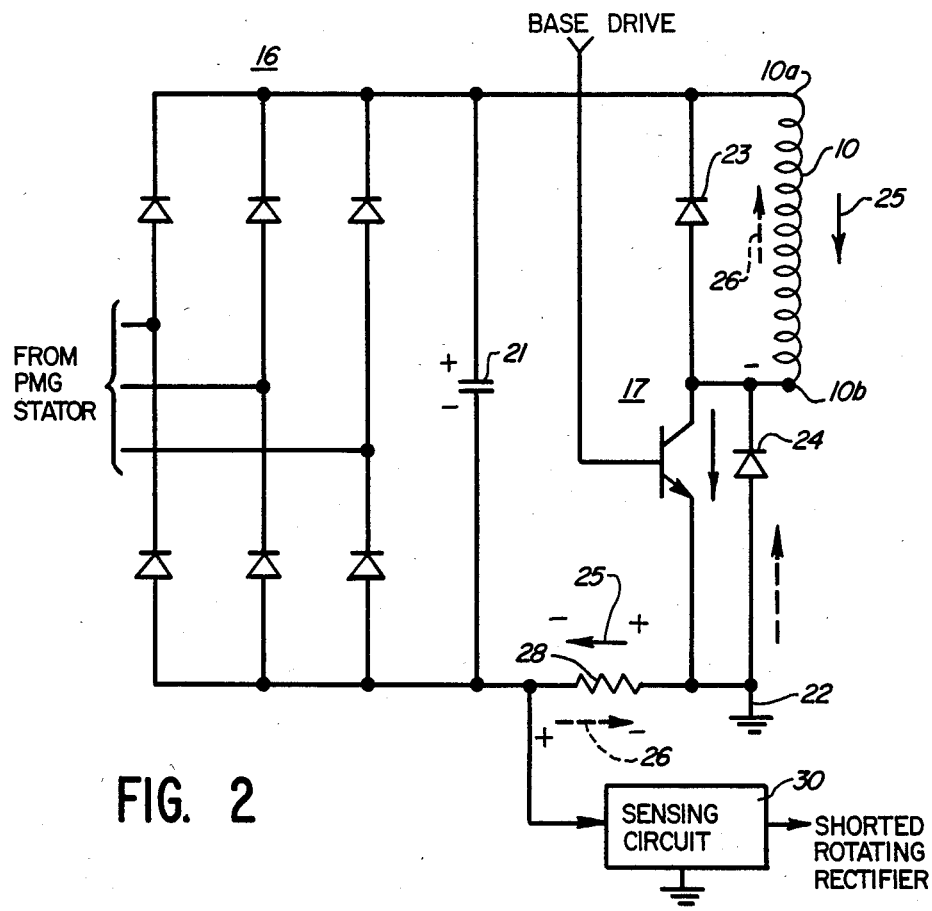
FIG. 2 is a schematic diagram of the field circuit of the brushless alternator and the shorted diode rectifier detector.

Turning now to FIG. 2, the three phase output from the PMG stator is connected with three phase full wave diode rectifier 16 which has a filter capacitor 21 connected across the rectifier output, providing a DC source for exciter field winding 10.

The exciter field winding 10 is connected in series with the collector-emitter circuit of NPN transistor voltage regulator amplifier 17. Terminal 10a of the winding is connected with the positive terminal of the DC source and terminal 10b is connected with the collector element of transistor 17. The emitter element of transistor 17 is returned to the DC reference or ground 22. A pulse width modulated base drive signal from the voltage regulator 19 is connected with the base element of transistor 17, controlling conduction of the transistor and the current through field winding 10. Diode 23 is connected across field winding 10 and conducts when transistor 17 is shut off to allow the current to continue to flow through the field winding.

Diode 24 is connected across the collector-emitter circuit of transistor 17 and poled oppositely to the emitter-collector circuit. Diode 24 limits the negative potential of the transistor collector element, and thus terminal 10b of the field winding, to one diode drop or approximately 0.5 volts, below the reference potential.

In normal operation, i.e., without a shorted diode in the rotating rectifier, the field current is in the direction shown by the solid line arrow 25 through the field winding from terminal 10a to terminal 10b.

Upon occurrence of a shorted diode in the rotating rectifier, the generator field winding 10 acts as an energy or voltage source. This in turn influences the voltages at the field winding terminals 10a, 10b. The positive end 10a of the field winding puts energy into the DC source filter capacitor 21. The voltage at terminal 10a rises, back biases the PMG rectifier supply 16 and is reflected on capacitor 21. This causes a reverse field current to flow from the terminal 10a through capacitor 21 and diode 24, back to the field winding 10 and diode 23. The reverse current is indicated by the dashed arrow 26.

The reverse current which flows when a diode is shorted is utilized in the detector of this invention. A current sensing resistor 28 is connected between the junction of the emitter of transistor 17 with the anode of diode 24 and ground 22, and the negative terminal of the field current power supply. The normal field current 25 flowing through resistor 28 establishes a voltage drop with the left end of the resistor negative and the right end positive. A shorted diode and reverse field current flow causes a voltage drop with the left end of resistor 28 positive and the right end negative. This change in the polarity of the voltage across the current sensing resistor 28 signifies that there is a shorted rotating rectifier.

A sensing circuit 30 is connected with the left end of resistor 28 and with ground 22. Upon the occurrence of a voltage positive with respect to ground at the input of sensing circuit 30, an output is established indicating that a diode in the rotating rectifier is shorted. This output may be utilized to shut down the alternator or to give an alarm, as to an operator. In a system having a programed microprocessor generator control, the sensing circuit 30 provides an input to the microprocessor.

We claim:

1. In a brushless alternator having an exciter field circuit including a source of DC potential with a reference, a stationary exciter field winding and an emitter collector circuit of a voltage regulator transistor connected in series with the field winding across the DC source, a rotor with an exciter armature, a diode rectifier connected with said armature and a main field winding connected with the diode rectifier, a stator winding in which the alternator output voltage is developed coupled with the main field winding, and a voltage regulator responsive to the alternator output providing a base drive signal to the voltage regulator transistor, an improved detector for a shorted diode rectifier, comprising:

a sensing circuit responsive to the direction of current flow through the exciter field winding for indicating the occurrence of a shorted diode on the rotor.

2. The shorted diode detector of claim 1 in which a resistor is connected in series with the exciter field winding, the polarity of the voltage across the resistor indicating the direction of current flow through the field winding, and in which said sensing circuit is responsive to the polarity of the voltage across said resistor.

3. The shorted diode detector of claim 1 wherein a diode is connected in parallel with the emitter collector circuit of the transistor and reversely poled with respect to the emitter collector circuit, the detector including a current indicating resistor connected in series with the emitter collector circuit of the transistor and the diode to conduct field current in either direction and in which said sensing circuit is connected with the resistor and is responsive to the polarity of the voltage across the resistor.

4. In a brushless alternator having a stationary exciter field winding, a rotor with an exciter armature, a diode rectifier connected with said armature and a main field winding connected with the diode rectifier, and a stator winding in which the alternator output voltage is developed coupled with the main field winding, an exciter field circuit including a voltage regulator transistor connected with the exciter field winding, a DC power supply for said exciter field circuit, said power supply having a shunt connected capacitor across its output, and a voltage regulator responsive to the alternator output providing a base drive signal to the voltage regulator transistor, the circuit of the exciter field winding in series with the parallel combination of the voltage regulator transistor and a shunt diode being connected across said power supply capacitor, an improved detector for a shorted diode rectifier, comprising:

a sensing circuit responsive to the direction of current flow through the series circuit of the field winding, transistor and shunt diode.

5. The shorted diode detector of claim 4 including a resistor in series in the exciter field circuit between the parallel combination of the transistor and shunt diode and the power supply capacitor, the sensing circuit being responsive to the polarity of the voltage across said resistor.

* * * * *